United States Patent [19]

Lockbrunner et al.

[11] 4,072,378
[45] Feb. 7, 1978

[54] PROTECTIVELY COVERED MOUNTING FOR A PLUG-IN ELECTRONIC APPARATUS OF A MOTOR VEHICLE

[75] Inventors: Eduard Lockbrunner, Hemmingen; Dietmar Schnepf, Esslingen, both of Germany

[73] Assignee: Robert Bosch GmbH, Stuttgart, Germany

[21] Appl. No.: 746,709

[22] Filed: Dec. 2, 1978

[30] Foreign Application Priority Data

Dec. 5, 1975 Germany .......................... 2554747

[51] Int. Cl.² ..................... H05K 7/10; H01R 13/50
[52] U.S. Cl. ............................. 339/17 C; 339/59 M; 339/147 P; 361/388; 361/399
[58] Field of Search ............. 339/17 R, 17 C, 17 CF, 339/17 LC, 17 LM, 17 M, 17 L, 147 P, 10, 59 M, 176 MP, 18 P, 192 R; 361/388, 415, 399

[56] References Cited

U.S. PATENT DOCUMENTS

| 2,967,979 | 1/1961 | Plesser et al. ...................... 339/17 C |
| 3,205,471 | 9/1965 | Herrmann ....................... 339/17 LM |
| 3,493,916 | 2/1970 | Hansen ............................. 339/17 LC |
| 3,706,954 | 12/1972 | Krafthefer ........................ 339/91 R |

*Primary Examiner*—Neil Abrams
*Assistant Examiner*—Neil Abrams
*Attorney, Agent, or Firm*—Flynn & Frishauf

[57] ABSTRACT

An insulating cover forms two wiring cavities over a heat-sink base plate, between which cavities a conductor pattern plate mounted on the base plate extends. The cover also provides an integral connector shell. The larger part of the base plate is within a first wiring cavity in which circuit components are mounted on the base plate and bonded by wires to the conducting pattern plate. The second wiring cavity encloses contact springs affixed to the connector means and soldered to the pattern plate and this cavity is closed off with a cover plate that snaps into place. The protection so provided for the apparatus is adequate for the conditions in a motor vehicle engine compartment.

9 Claims, 2 Drawing Figures

PROTECTIVELY COVERED MOUNTING FOR A PLUG-IN ELECTRONIC APPARATUS OF A MOTOR VEHICLE

This invention relates to a protectively covered mounting for a plug-in electronic control apparatus made up mostly of electronic components for motor vehicle use.

It has heretofore been proposed to provide electronic control apparatus in which the individual parts of the housing are welded together, with additional soldering to seal the housing hermetically. Such a housing is particularly well suited for highly sensitive electronic control apparatus that must be hermetically closed off from the environment. The manufacture of such housings is, however, very expensive.

It is an object of the present invention to provide an electronic control apparatus housing and mounting suitable for integrated and hybrid circuits and suitable for holding and protecting such circuits in the exposed and mechanically rough environment of the engine compartment of a motor vehicle and which provides a sufficiently good enclosure against such an environment, an adequate heat removal capability, and a good contact to the electrical system of the vehicle through connectors that are not vulnerable to sprayed water nor to mounting position and which has a compact structural constitution.

SUMMARY OF THE INVENTION

Briefly, the electronic components are fixedly mounted on a base plate of thermally conducting material as is also a conductor pattern plate. A cover covering a portion of the base plate, to form a first wiring cavity in which the electronic components are located, is provided with plug connectors and forms a recess for accepting a mating connector and, further, forms with the base plate a second wiring cavity into which extend the control apparatus ends of the plug connectors and, finally, a cover plate removably covers the second wiring cavity. The conductor pattern plate is interposed between an edge of the cover and the base plate, so that it extends into both the first and the second wiring cavities and provides electric connections between them. The ends of the plug connectors in the second wiring cavity are provided with spring members that bear against the corresponding circuit paths of the conductor pattern plate in the second wiring cavity. The electronic circuit components and the conductor pattern plate are preferably rectangular with their sides parallel or perpendicular to a pair of parallel sides of the base plate and the electrical connections between the circuit units and between the circuit units and the conductor pattern plate are preferably at right angles or parallel to the respective edges of the electronic components and the conductor pattern plate.

The first and second wiring cavities may be filled with a soft covering material.

The invention is further described by way of illustrative example with reference to the accompanying drawings, in which:

Figures 1, 2:
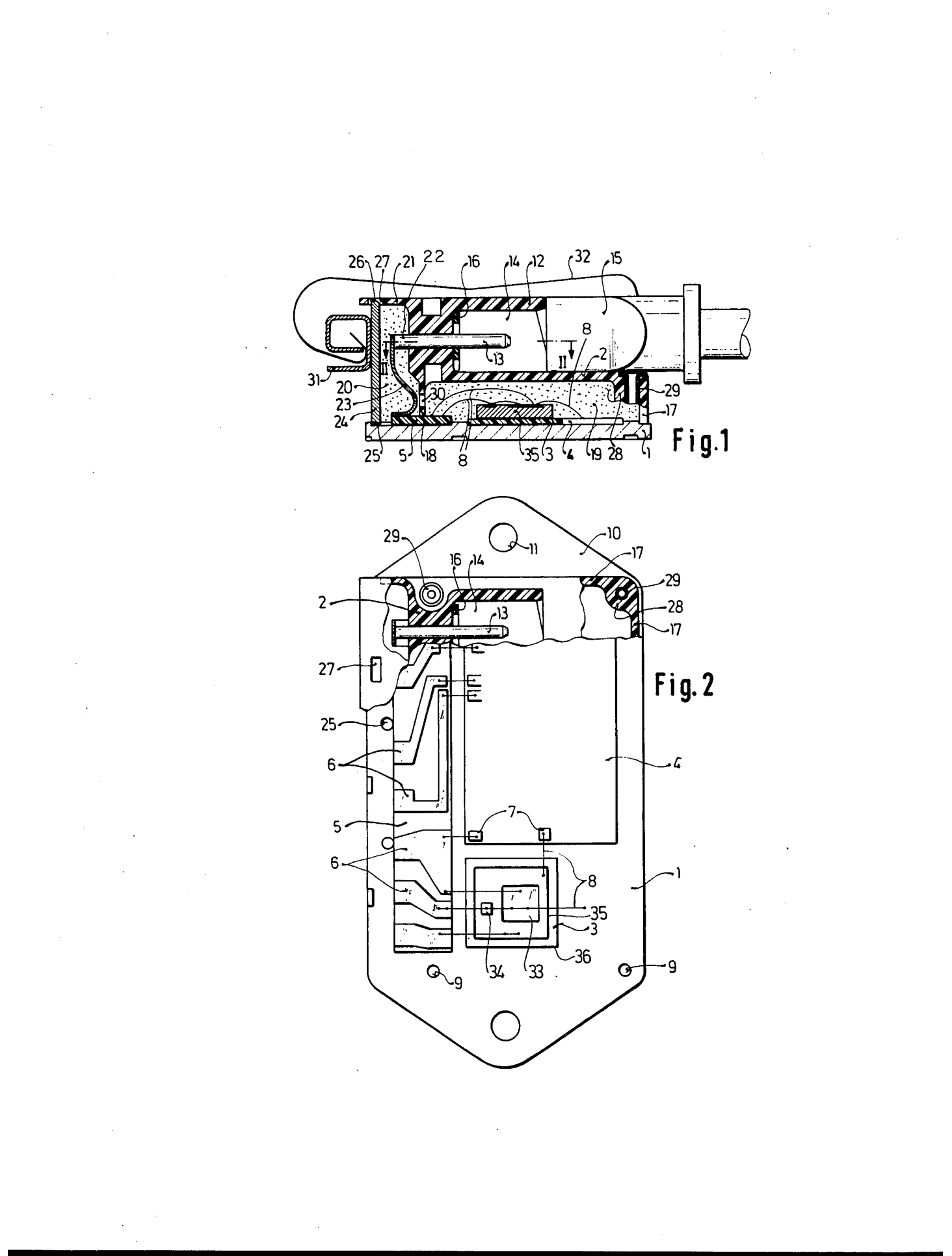

FIG. 1 is a cross-section of an electronic control apparatus of a motor vehicle provided with a protectively covered mounting according to the invention, and FIG. 2 shows the electronic control apparatus of FIG. 1 partly in a top view looking down on the base plate and partly in a section along the line II—II of FIG. 1.

As shown in the drawings, the electronic control apparatus illustrated is housed in a casing made up essentially of a base plate 1 and a cover 2. The base plate 1 consists of heatconducting material, such as a convenient metal. It carries a power circuit unit 3, which comprises two integrated circuit chips 33 and 34 mounted on a copper block 35 that serves as a heat sink. The latter is soldered to a metallized alumina plate 36 which is metallized both on top and bottom for solder fastening. Thus, it is soldered to the base plate 1 as well as to the copper heat sink 34 for heat conduction and heat-resistive mounting, but effectively insulates the copper block and the base plate.

In addition, the base plate carries a thick film plate unit 4 and a conductor pattern plate 5, which are fastened onto the base plate by an adhesive. The conducting paths 6 of the conducting pattern plate 5 are connected to electronic components 7 of a control circuit on the thick film plate 4 and on the power unit 3 by means of bonded wires 8 that are parallel and at right angles to the respective rectangular edges of the conductor pattern plate 5, the thick film plate 4 and the power unit 3. The base plate 1 thus equipped can be tested as a composite assembly component and any defects can be corrected at that stage.

The base plate 1 is provided with mounting holes 9 for the cover 2 and with mounting tabs 10 of its own in which mounting holes 11 appear.

A second subassembly part constitutes the cover 2. It is a molding or casting of insulating material the upper portion of which serves as a connector shell 12 in which connecting plugs 13 are fixed. The connecting plugs 13 have a long projecting end extending into a cavity 14 which is designed to accept a mating connector 15. At the deep end of the cavity 14 a seal ring 16 is located.

The lower portion of the cover 2 is surrounded by a rim 17 designed to be seated on three sides on the base plate 1 and on its fourth side 18 on the conductor pattern plate 5. The cover 2 with its rim walls 17 and 18 encloses a first wiring space or cavity of the control apparatus unit in which the components 4 and 7 of the control circuit and the power stage 3 are situated.

A second wiring cavity 20 is bounded by the portion of the base plate 1 extending beyond the sidewall 18 of the cover, part of which is covered by the conductor pattern plate 5 and by rim walls 21 to the rear of the connector shell 12. The rear ends of the plug connectors extend into this wiring cavity 20 and carry contact springs 23 welded on. These contact springs are pretinned and stand in electrical contact with the corresponding conducting paths 6 on the portion of the conducting pattern plate extending into the wiring cavity 20 and are soldered on there by a mass soldering process as, for example, wave soldering. The soldering of the contact springs 23 takes place after the fastening of the cover 2 on the base plate 1 (see further below). The second wiring cavity 20 is closed off by a cover plate 24 which seats in positioning holes 25 of the base plate 1 and latches in position by means of a projection 26 nesting in a catch opening 27.

The cover 2 is provided with eyes in which rivets 29 are seated that extend through the fastening holes 9 of the base plate 1. The base plate 1 and the cover 2 are fastened firmly and sufficiently tightly together by rivets.

For further protection of the electric and electronic components 3 to 8, 22 and 23, the wiring cavities 19 and 20 are filled with a soft filler material such as a flexible foamed resin, now shown in the drawings. The filler material is introduced into the first wiring cavity 19 to the second wiring cavity 20 through a hole 30 in the side 18 of the cover rim.

A holding member 31 is pressed against the cover plate 24 by means of a leaf spring 32 hooked over into the holding member 31. The bent leaf spring 31 grips around over the portion of the cover 2 that constitutes the connector shell 12 and around the mating connector 15. It holds the connector 15 against the sealing ring 16 at the back of the cavity 14 by means of its springs pressure.

The base plate 1 serves to carry the electronic components of a control circuit and its power unit and also to carry away the heat that is produced particularly by the relatively strongly heat dissipating power unit 3. Since the mounting of the electronic components is done on the plane base 1, it is simple to carry out and the bonding places are readily accessible, even for highly mechanized bonding procedures.

The other main component of the casing, the cover 2, on the other hand, takes care of the protection of the electrical and electronic components both of the control circuit proper and also of the connectors for connecting the apparatus to the power system of a motor vehicle. The fastening of the cover in accordance with the invention produces a compact form of construction and good accessibility for the connector 15 that engages with the connector built into the control apparatus.

By the provision of the conductor pattern plate 5 so that it can have connections in both wiring cavities 19 and 20, the conducting paths 6 of the pattern plate can be particularly conveniently arranged between the contact springs 24 and the various connections to the electronic components of the circuit.

Although the invention has been described with reference to a specific illustrative example, variations are possible within the inventive concept.

We claim:

1. A protectively covered mounting for a plug-in electronic control apparatus of a motor vehicle that comprises electronic components, which mounting comprises:
  a base plate (1) of thermally conducting material on which said electronic components (3,4) are fixedly mounted;
  a conductor pattern plate (5) likewise fixedly mounted on said base plate (1);
  a cover (2) covering a portion of said base plate (1) so as to form first (19) and second (20) wiring cavities on opposite sides of a wall of said cover which is substantially perpendicular to said base plate (1) and having plug connectors (13,22) held therein and also a recess for accepting a mating connector (15) insertable into said recess from outside of said cover, said recess having no part thereof adjacent to said base plate (1), said plug connectors having their control apparatus ends extending into said second wiring cavity (20) and their other ends extending into said recess (14);
  electronic components on said base plate in said first wiring cavity, and--.
  a cover plate (24) removably covering said second wiring cavity with one edge of said cover plate adjacent to said base plate (1) and the other edges thereof adjacent to walls of said cover (2).

2. A protectively covered vehicular electronic apparatus mounting as defined in claim 1, in which said first and second wiring cavities (19,20) have their otherwise unoccupied space filled with a soft filling material.

3. A protectively covered vehicular electronic apparatus mounting as defined in claim 1, in which spring catch means (32) are provided for engagement with the outside of said mating connector (15) when the latter is in connection position with said plug connectors (13,22).

4. A protectively covered vehicular electronic apparatus mounting as defined in claim 3, in which said spring catch means (32) also bear against said cover plate (24).

5. A protectively covered mounting for a plug-in electronic control apparatus of a motor vehicle that comprises electronic components, which mounting comprises:
  a base plate (1) of thermally conducting materials on which said electronic components (3,4) are fixedly mounted;
  a cover (2) covering a portion of said base plate (1) so as to form therewith first (19) and second (20) wiring cavities on opposite sides of a wall (18) of said cover and having plug connectors (13,22) held therein and also a recess (14) for guiding and accepting a mating connector (15), said plug connectors having their control apparatus ends extending into said second wiring cavity (20) and their other ends extending into said recess (14);
  electronic components on said base plate in said first wiring cavity;
  a conductor pattern plate (5) fixedly mounted on said base plate (1) and interposed between the edge of said wall (18) of said cover (2) and said base plate (1) so as to extend into both said first and second wiring cavities and to provide electrical connections between them, and
  a cover plate (24) removably covering said second wiring cavity.

6. A protectively covered vehicular electronic apparatus mounting as defined in claim 5, in which said electronic components (3,4) are connected electrically to conducting paths (6) of said conductor pattern plate (5) by electrical connection means (8) situated in said first wiring cavity (19).

7. A protectively covered vehicular electronic apparatus mounting as defined in claim 6, in which said connecting means (8) run so that their projections mapped on said base plate (1) are substantially straight lines crossing boundaries of said electronic components (3,4) and of said conductor pattern palte (5) substantially at right angles.

8. A protectively covered vehicular electronic apparatus mounting as defined in claim 7, in which said connecting means (8) are in the form of bonding wires.

9. A protectively covered vehicular electronic apparatus mounting as defined in claim 5, in which the ends of plug connectors (13,22) extending into said second wiring cavity (20) are there connected with contact springs (23) which stand in contact respectively with corresponding conducting paths (6) of said conductor patern plate (5).

* * * * *